United States Patent
Ono et al.

(10) Patent No.: US 11,867,317 B1
(45) Date of Patent: Jan. 9, 2024

(54) NORMALLY-CLOSED FLOW RATE CONTROL VALVE

(71) Applicant: LINTEC CO., LTD., Shiga (JP)

(72) Inventors: Hirofumi Ono, Shiga (JP); Kenta Yamamoto, Shiga (JP)

(73) Assignee: LINTEC CO., LTD., Shiga (JP)

( * ) Notice: Subject to any disclaimer, the term of this patent is extended or adjusted under 35 U.S.C. 154(b) by 0 days.

(21) Appl. No.: 18/547,602

(22) PCT Filed: Oct. 26, 2021

(86) PCT No.: PCT/JP2021/039434
§ 371 (c)(1),
(2) Date: Aug. 23, 2023

(87) PCT Pub. No.: WO2022/201614
PCT Pub. Date: Sep. 29, 2022

(30) Foreign Application Priority Data

Mar. 23, 2021 (JP) .................................. 2021-048898

(51) Int. Cl.
*F16K 7/14* (2006.01)
*F16K 31/00* (2006.01)
(Continued)

(52) U.S. Cl.
CPC .............. *F16K 7/14* (2013.01); *F16K 31/004* (2013.01); *H10N 30/02* (2023.02); *H10N 30/88* (2023.02)

(58) Field of Classification Search
CPC ......... F16K 31/004; F16K 7/14; H10N 30/02; H10N 30/88
(Continued)

(56) References Cited

U.S. PATENT DOCUMENTS 7,267,111 B2 * 9/2007 Liskow ................ F02M 61/167
123/498
7,644,878 B2 * 1/2010 Mochizuki ......... F02M 51/0603
123/498
(Continued)

FOREIGN PATENT DOCUMENTS

JP    H01-55487 A     3/1989
JP    2004-162733 A   6/2004
(Continued)

OTHER PUBLICATIONS

International Search Report dated Dec. 14, 2021, for the corresponding patent application No. PCT/JP2021/039434, with English translation.
(Continued)

*Primary Examiner* — William M McCalister
(74) *Attorney, Agent, or Firm* — LUCAS & MERCANTI, LLP

(57) ABSTRACT

A flow rate control valve includes a base block and a valve opening/closing mechanism. The base block is provided with a valve chamber in which a valve seat through which a liquid raw material L flows, and a diaphragm that is brought into contact with or separated from the valve seat so as to close/open the valve seat are installed. The valve opening/closing mechanism includes a slide bearing part, a support post part, a piezoelectric actuator part, and a valve-actuating part. The slide bearing part is installed on the base block 1 and is provided with a bearing. The support post part includes a support post that is inserted slidably in the bearing and that moves upward and downward in a diaphragm direction.

3 Claims, 4 Drawing Sheets

(51) Int. Cl.
  *H10N 30/88* (2023.01)
  *H10N 30/02* (2023.01)
(58) Field of Classification Search
  USPC .......................................... 251/129.06, 129.2
  See application file for complete search history.

(56) References Cited

U.S. PATENT DOCUMENTS

| | | | | |
|---|---|---|---|---|
| 8,181,932 | B2* | 5/2012 | Matsumoto | F16K 31/007 |
| | | | | 251/61.4 |
| 8,729,774 | B2* | 5/2014 | Moler | H10N 30/88 |
| | | | | 310/328 |
| 9,163,743 | B2* | 10/2015 | Hidaka | F16K 7/14 |
| 9,625,047 | B2* | 4/2017 | Hirose | F16K 31/007 |
| 10,156,295 | B2* | 12/2018 | Yasumoto | H10N 30/88 |
| 10,247,326 | B2* | 4/2019 | Schupp | F16K 31/004 |
| 10,372,145 | B2* | 8/2019 | Hirose | F16K 31/007 |
| 10,573,801 | B2* | 2/2020 | Shigyou | F16K 37/005 |
| 11,346,457 | B2* | 5/2022 | Dohi | F16K 31/007 |
| 2004/0041111 | A1* | 3/2004 | Boecking | F02M 63/0026 |
| | | | | 251/129.06 |
| 2010/0127196 | A1* | 5/2010 | Sawada | F16K 31/007 |
| | | | | 251/129.06 |
| 2010/0294964 | A1* | 11/2010 | Matsumoto | F16K 7/14 |
| | | | | 251/129.01 |
| 2011/0108126 | A1* | 5/2011 | Monkowski | F16K 7/14 |
| | | | | 137/12 |
| 2011/0315905 | A1* | 12/2011 | Hirose | G01F 1/40 |
| | | | | 251/12 |
| 2016/0047483 | A1* | 2/2016 | Hirose | F16K 27/0236 |
| | | | | 137/602 |
| 2016/0252913 | A1* | 9/2016 | Hirata | F16K 7/14 |
| | | | | 137/486 |
| 2016/0327963 | A1* | 11/2016 | Hirata | F16K 31/02 |
| 2016/0363231 | A1* | 12/2016 | Yasumoto | H10N 30/02 |
| 2017/0254430 | A1* | 9/2017 | Hirata | H10N 30/886 |
| 2020/0103047 | A1* | 4/2020 | Beuschel | F16K 31/025 |
| 2020/0132216 | A1* | 4/2020 | Funakoshi | F16K 31/1225 |
| 2022/0057002 | A1* | 2/2022 | Shigyou | G05D 7/06 |
| 2022/0082176 | A1* | 3/2022 | Tanno | F16K 7/14 |
| 2022/0260171 | A1* | 8/2022 | Margol | F16K 31/005 |

FOREIGN PATENT DOCUMENTS

| | | |
|---|---|---|
| JP | 2017-057911 A | 3/2017 |
| WO | 2015/045987 A1 | 4/2015 |
| WO | 2015/125438 A1 | 8/2015 |

OTHER PUBLICATIONS

Taiwanese Office Action dated Nov. 30, 2022 for the corresponding Taiwanese Patent Application No. 111109062, with machine English translation.

* cited by examiner (a)

(b)

NORMALLY-CLOSED FLOW RATE CONTROL VALVE

CROSS REFERENCE TO RELATED APPLICATION

This Application is a 371 of PCT/JP2021/039434 filed on Oct. 26, 2021, which claimed priority of Japanese Application No. 2021-048898 filed on Mar. 23, 2021, both of which are incorporated herein by reference.

TECHNICAL FIELD

The present invention relates to a normally-closed flow rate control valve that is installed in a vaporization device used for vaporizing a liquid raw material in manufacturing a semiconductor and that uses a piezoelectric element.

BACKGROUND ART

A flow rate control valve for performing flow rate control of a liquid raw material has been required to be applicable to, for example, atomic layer deposition (ALD) in recent years. In such application, a flow rate is required to be changed at a high speed in a short time by opening/closing a control valve according to a high-speed (having a very short cycle) pulse-shaped control signal. A valve opening/closing driving component applicable to such pulse flow rate control and superior in responsiveness includes a piezoelectric element that expands/contracts simultaneously upon ON/OFF of voltage.

As a flow rate control valve, for a liquid raw material, in which the piezoelectric element is used in a valve drive part thereof, "normally-opened" ones are commonly used. The normally-opened flow rate control valve is configured such that, when voltage applied to a piezoelectric element for driving a valve is zero, the valve is opened so as to allow a liquid raw material to be supplied to a vaporizing chamber provided in the succeeding vaporizer. Therefore, when no voltage is applied due to malfunction of a piezoelectric actuator, power failure, or the like, the liquid raw material is supplied to the vaporizing chamber. When operation is resumed after repair of the piezoelectric actuator or power failure recovery, the liquid raw material having flowed into the vaporizing chamber is gasified and is supplied to a reaction furnace at once, and thus a semiconductor wafer, etc. may be damaged.

Accordingly, a "normally-closed" fluid control valve using a piezoelectric element has been proposed (Patent Literature 1). In the "normally-closed" fluid control valve disclosed in Patent Literature 1, a hollow valve rod is provided in a circular cylindrical member fixed to an upper surface of a valve body, a pressing spring is interposed between a ceiling surface of the circular cylindrical member and an upper end stepped part of the valve rod, and the valve rod is pressed to a valve seat side via a diaphragm provided in the valve body, so that the valve is "closed"; and a piezoelectric element is provided in a space inside the valve rod, an upper surface of the element is abutted on an upper inner surface in the space of the valve rod, a lower surface of the element is fixed to the valve body and is abutted on a bridge that serves as a reference of a change in length of the piezoelectric element, and the valve rod is pressed up by applying voltage to the element, thereby separating the diaphragm from the valve seat, so that the valve is "opened".

CITATION LIST

Patent Literature

[PTL 1] Japanese Laid-Open Patent Publication No. H1-55487

SUMMARY OF INVENTION

Technical Problem

In this valve, the diaphragm is driven by ON/OFF of the piezoelectric element, and a "normally-closed state" becomes an "opened state" upon ON and the "opened state" becomes a "closed state" upon OFF as described above. However, a change in length of the piezoelectric element is minute, and thus thermal expansions of the valve rod for transmitting the change in length of the piezoelectric element and the circular cylindrical member including the valve rod therein are extremely important. In Patent Literature 1, the valve rod and the circular cylindrical member are each formed of a general metal member (e.g., stainless steel). Thus, when heat is transferred from the valve body or the surroundings, the length of each of the valve rod and the circular cylindrical member themselves changes, so that the change in length of the piezoelectric element cannot be precisely transmitted to the diaphragm.

In addition, force for pressing the diaphragm to the valve seat by the valve rod influences the closing performance for the valve seat (liquid leakage is caused when the pressing force is weak, and the valve seat is damaged when the pressing force is too strong). Thus, an adjustment function to optimize the pressing spring is also a function indispensable to the normally-closed flow rate control valve, but the valve described in Patent Literature 1 lacks the adjustment function.

The present invention has been made in view of such problems of the above conventional example, and the object of the present invention is to provide a normally-closed flow rate control valve that, firstly, can precisely and quickly transmit a change in length of a piezoelectric element without thermal influence and, secondly, can appropriately adjust a pressing force from a diaphragm to the valve seat.

Solution to Problem

A flow rate control valve A of a liquid raw material vaporization device described in claim 1 is directed to a normally-closed flow rate control valve A including:

a base block 1 provided with a valve chamber 4 in which a valve seat 3 through which a liquid raw material L flows and a diaphragm 5 that is brought into contact with or separated from the valve seat 3 so as to close/open the valve seat 3 are installed; and a valve opening/closing mechanism 10 that performs opening/closing drive of the diaphragm 5, in which the valve opening/closing mechanism 10 includes:

a slide bearing part 20 installed on the base block 1 and provided with a bearing 24;

a support post part 30 including a support post 31 that is inserted slidably in the bearing 24 and that moves upward and downward in a diaphragm direction;

a piezoelectric actuator part 40 provided between the slide bearing part 20 and the support post part 30, the piezoelectric actuator part 40 including a piezoelectric element 45 that expands by application of voltage, and presses up the support post part 30 in such a direction as to separate the support post part 30 from the diaphragm 5 with respect to the slide bearing part 20 as a reference; and a valve-actuating part 50 that is provided from the support post part 30 toward the diaphragm 5 and that performs opening/closing drive of the diaphragm 5 along up-and-down movement of the support post part 30, the support post 31 of the support post part 30 is made of a low thermal expansion member;

the slide bearing part 20 includes a bearing lower part 25 that is bottomed and that has an opened upper face, and a bearing upper part 21 that is screwed movably forward and backward in the bearing lower part 25 and that is provided with the bearing 24 in which the support post 31 is inserted, the support post part 30 includes the support post 31, an upper end support member 33 that is provided on an upper end of the support post 31 and on which an upper end of the piezoelectric actuator part 40 is abutted, and a lower end support member 37 provided between the bearing upper part 21 and the bearing lower part 25, and an elastic member 60 is installed between the bearing upper part 21 and the lower end support member 37.

According to claim 2, in the flow rate control valve A of the liquid raw material vaporization device described in claim 1, the base block 1 includes a base block lower part 1a including the valve chamber 4 formed therein, and a base block upper part 1b on which the slide bearing part 20 is provided, and at least one of a cooling space R and a cooling fin 8 is disposed in the base block upper part 1b.

According to claim 3, in the flow rate control valve A of the liquid raw material vaporization device described in claim 1 or 2, the valve-actuating part 50 includes a plunger 51 provided from the support post part 30 toward the diaphragm 5, a protective plate 52 that is in planar contact with an upper surface of the diaphragm 5, and a steel ball P3 provided between the plunger 51 and the protective plate 52.

Advantageous Effects of Invention

The present invention is directed to the "normally-closed" flow rate control valve A using the piezoelectric element 45 in the above configuration. The support post 31 is made of a low thermal expansion member. Therefore, in the normally-closed flow rate control valve A, expansion/contraction of the piezoelectric element 45 can be precisely transmitted to the valve-actuating part 50 without being affected by a change in the ambient temperature, and valve opening/closing by the diaphragm 5 can be precisely performed. Furthermore, at least one of the cooling space R and the cooling fin 8 is disposed in the base block upper part 1b, whereby heat on the base block lower part 1a side is prevented from being transferred to the support post part 30 side, so that thermal influence on a change Δt itself in length of the piezoelectric element 45 on the support post part 30 side and transmission of such a change can be prevented.

The elastic member 60 is installed between the bearing upper part 21 and the lower end support member 37, and the bearing upper part 21 is screwed movably forward and backward in the bearing lower part 25, whereby a pressing force F of the elastic member 60 during closing of the diaphragm 5 can be appropriately adjusted.

With the protective plate 52, the steel ball P3 is prevented from making point contact with the diaphragm 5 and is allowed to make surface contact with the diaphragm 5, thereby preventing the steel ball P3 from damaging the diaphragm 5. The steel ball P3 is interposed between the protective plate 52 and the plunger 51, whereby the pressing force F from the plunger 51 can be perpendicularly applied to the protective plate 52, and eventually to the diaphragm 5, and thus surface contact of the protective plate 52 with the diaphragm 5 can be perfected.

BRIEF DESCRIPTION OF DRAWINGS

FIG. 1(a) is a longitudinal cross-sectional view when no voltage is applied, and FIG. 1(b) is a longitudinal cross-sectional view when voltage is applied, according to one embodiment of the present invention.

FIG. 3(a) is a view along arrows W-W in FIG. 1(b), FIG. 3(b) is a view along arrows X-X in FIG. 1(b), FIG. 3(c) is a view along arrows Y-Y in FIG. 1(b), and FIG. 3(d) is a view along arrows Z-Z in FIG. 1(b).

FIG. 4(a) is a partially enlarged view of a valve chamber in which a diaphragm in FIG. 1 is in a closed state, and FIG. 4(b) is a partially enlarged view of the valve chamber in which the diaphragm in FIG. 1 is in an opened state.

DESCRIPTION OF EMBODIMENTS

Figure 1:
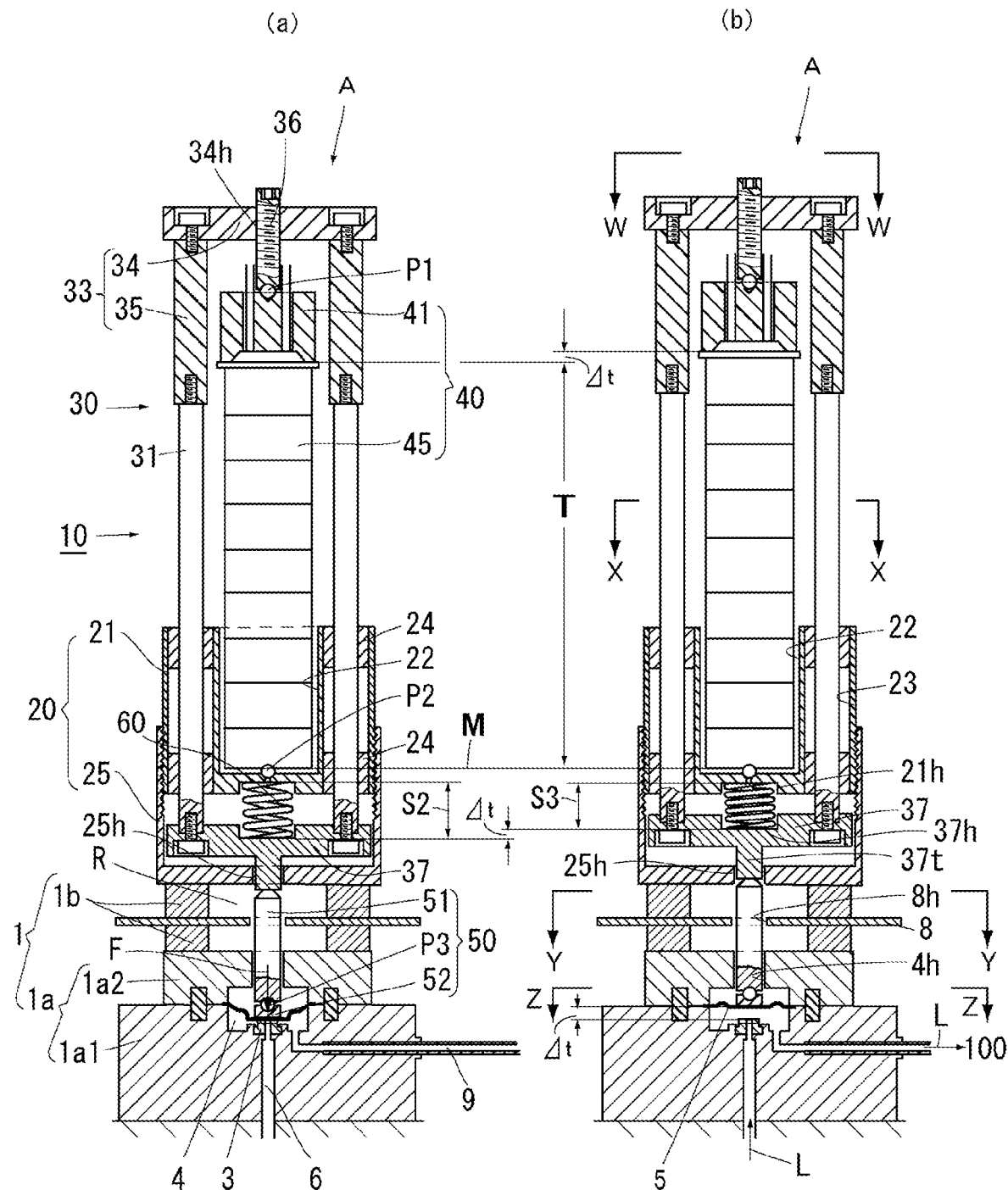
FIG. 1 is as follows.

Hereinafter, the present invention will be described in detail according to illustrated embodiments. A flow rate control valve A of a liquid raw material vaporization device includes a base block 1 and a valve opening/closing mechanism 10.

In the present embodiment, the base block 1 includes two blocks: a base block lower part 1a and a base block upper part 1b.

The base block lower part 1a includes a first lower part Tal, and a second lower part 1a2 mounted on the first lower part 1a1.

A valve chamber 4 is a space part having a circular shape in a planar view and is provided between the first lower part 1a1 and the second lower part 1a2. The valve chamber 4 is divided in a liquid-tight manner into an upper part and a lower part by a diaphragm 5 described below, and the lower part on the first lower part Tal side is referred to as valve chamber lower part 4a and the upper part on the second lower part 1a2 side is referred to as valve chamber upper part 4b, with the diaphragm 5 as the boundary. Since the valve chamber 4 is divided in a liquid-tight manner into the upper part and the lower part, a liquid raw material L never leaks from the valve chamber lower part 4a to the valve chamber upper part 4b.

A liquid raw material introduction passage 6 through which the liquid raw material L delivered from a storage tank (not shown) passes is formed in the first lower part 1a1, and communicates with a valve seat 3 accommodated in a valve seat accommodating hole 4s, through the valve seat accommodating hole 4s that is formed so as to be recessed in a bottom part of the valve chamber lower part 4a, in the present embodiment. The valve seat accommodating hole 4s having a circular shape in a planar view is formed so as to have such a depth as to allow a seat part 3a of the valve seat 3 to be fitted therein. A ring-shaped projecting ridge part 4t is protrusively formed around the valve seat accommodating hole 4s. A bottom part of the valve seat accommodating hole 4s is formed lower by one stage than the ring-shaped projecting ridge part 4t.

A liquid raw material supply path 9 for supplying the liquid raw material L, which has flowed into the valve chamber lower part 4a of the valve chamber 4, to a vaporizing chamber 100 of a vaporizer (not shown) connected to the flow rate control valve A is provided so as to extend from the bottom part of the valve chamber lower part 4a toward a side face of the first lower part 1a1. In the present embodiment, the liquid raw material introduction passage 6 communicates with the valve seat 3 through the valve seat accommodating hole 4s, and the liquid raw material supply path 9 opens to the bottom part of the valve chamber lower part 4a. Although not shown, conversely, a passage opened to the bottom part of the valve chamber lower part 4a may be a liquid raw material introduction passage, and a passage communicating with the valve seat 3 may be a liquid raw material supply path and may be connected to the vaporizing chamber.

The valve chamber upper part 4b is provided in the second lower part 1a2. A plunger guide hole 4h is drilled in a ceiling part of the valve chamber upper part 4b, and a plunger 51 of the valve opening/closing mechanism 10 is guided so as to slide upward/downward therein.

Figure 4:
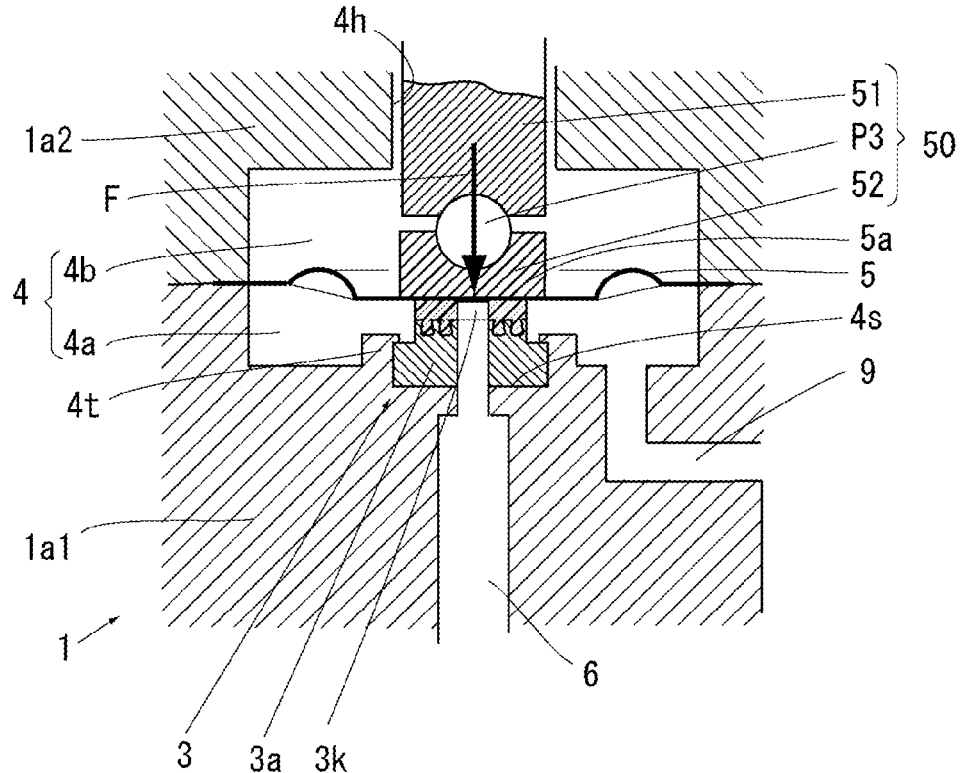
FIG. 4 is as follows.
Figure 4:
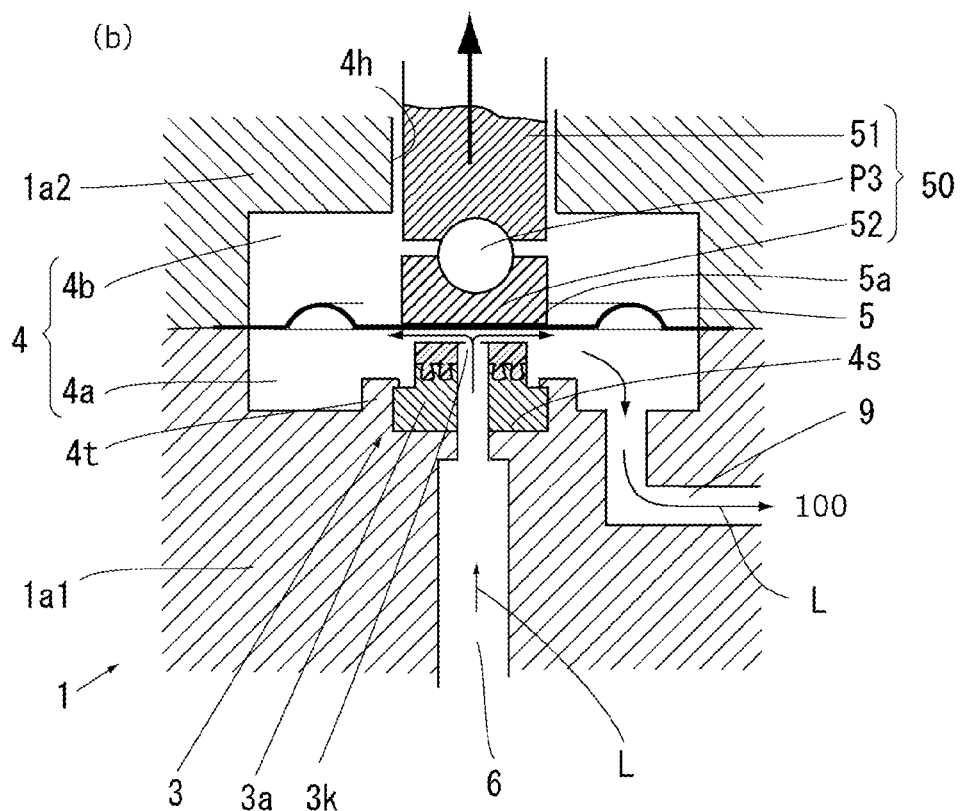

The diaphragm 5 is formed of a disk-shaped elastic thin plate having a concentrically projecting ridge formed therein, and a center portion thereof is flat-plate-shaped and serves as a valve part 5a that is brought into contact with or separated from the valve seat 3, and an outer circumferential portion thereof is held in a liquid-tight manner between the first lower part 1a1 and the second lower part 1a2. In a state in which no pressing force is applied to the valve part 5a, the valve part 5a at the center of the diaphragm 5 is separated from an opening/closing port 3k of the valve seat 3 with tension of the diaphragm 5 as shown in FIG. 4(b), and assembly is performed in this state. As described below, when the valve part 5a is pressed by a valve-actuating part 50 that is a part of the valve opening/closing mechanism 10, the valve part 5a is brought into contact with the opening/closing port 3k of the valve seat 3 to close the opening/closing port 3k of the valve seat 3 as shown in the FIG. 4(a). As described below, a pressing force F during closing is adjusted according to a deformation amount, based on a length over which a bearing upper part 21 is screwed into a bearing lower part 25 in the slide bearing part 20, by which an elastic member 60 placed at this portion is deformed. The pressing force F from the plunger 51 is removed due to an expansion action (voltage application) of a piezoelectric element 45, this separates the valve part 5a at the center of the diaphragm 5 from the opening/closing port 3k of the valve seat 3 due to returning tension of the diaphragm 5, and the valve part 5a is opened, so that the valve seat 3 is released from closing.

The base block upper part 1b is mounted on the base block lower part Ta. The base block upper part 1b of the present embodiment is formed from a plurality of post members (here, three post members) installed so as to stand at intervals from each other, and a disk-shaped cooling fin 8 is installed at a middle part thereof. A space between the post members is a cooling space R. Cross-sectional areas of the post members are smaller than that of the second lower part 1a2, and thus conduction of heat from the second lower part 1a2 is inhibited here. In addition, heat from the base block lower part 1a side is dissipated and radiant heat from the base block lower part 1a side is inhibited, by the cooling fin 8. Accordingly, in conjunction with the cooling space R, the cooling fin 8 inhibits thermal influence from the base block lower part 1a side on the valve opening/closing mechanism 10.

A through-hole 8h in which the plunger 51, which is a part of the valve-actuating part 50, is inserted is drilled at the center of the cooling fin 8. An outer diameter of the cooling fin 8 is formed to be at least larger than that of the second lower part 1a2 of the base block lower part Ta, so that radiant heat from the base block lower part 1a side to the valve opening/closing mechanism 10 is interrupted.

The valve opening/closing mechanism 10 includes the slide bearing part 20, a support post part 30, a piezoelectric actuator part 40 including the piezoelectric element 45, the valve-actuating part 50, and the elastic member 60. The valve opening/closing mechanism 10 has a function for performing precise and quick transmission of expansion/contraction of the piezoelectric element 45 to precisely and quickly perform opening/closing of the diaphragm 5. Therefore, the valve opening/closing mechanism 10 of the flow rate control valve A of the present invention is structured so as to minimize occurrence of an error due to thermal influence. Specifically, in conjunction with the above-described heat-insulating structure, a support post 31 having a low linear expansion coefficient is used, and expansion/contraction of the piezoelectric element 45 is directly transmitted to the diaphragm 5, whereby precise and quick valve opening/closing can be performed in the present invention.

The slide bearing part 20 includes the bearing upper part 21 and the bearing lower part 25.

The bearing lower part 25 is a bottomed cylindrical member having an opened upper face, and has a female thread formed on an upper part of the inner circumferential surface, and a through-hole 25h drilled at the center of a bottom part. The bearing lower part 25 is mounted on the base block upper part 1b.

The bearing upper part 21 is a columnar block, an element accommodating hole 22 having an opened upper face is drilled at the center of the bearing upper part 21, and a plurality of support post holding holes 23 (three support post holding holes in the present embodiment) are provided at the periphery of the element accommodating hole 22 so as to penetrate in the up-down direction. In the present embodiment, the support post holding holes 23 are formed at equal angular intervals on one circumference, and bearings 24 are respectively set therein. The support post 31 is inserted in the bearing 24. The bearing upper part 21 has a male thread formed on a lower part of an outer circumference and can thus be screwed movably forward and backward in the bearing lower part 25, and an insertion allowance with which the bearing upper part 21 is inserted into the bearing lower part 25 can be adjusted.

In a bottom part of the element accommodating hole 22 of the bearing upper part 21, a steel ball fixing hole 21k is drilled, and a second steel ball P2 that makes point contact with a bottom part of the piezoelectric element 45 described below and that serves as a measure for expansion/contraction of the piezoelectric element 45 is fitted in the steel ball fixing hole 21k. On the opposite side (lower surface) of the bottom part of the element accommodating hole 22, a spring upper part holding hole 21h is formed so as to be recessed.

The support post part 30 includes a plurality of the support posts 31 (three support posts 31 in the present embodiment), an upper end support member 33 mounted to upper parts of the support posts 31, and a lower end support member 37 mounted to lower parts of the support posts 31.

Each support post 31 is a columnar member in which a metal (e.g., iron-nickel alloy: invar) having a linear expansion coefficient close to zero is used. The support post 31 is inserted in the bearing 24 of the slide bearing part 20 and slides smoothly in the up-down direction.

The upper end support member 33 includes a disk-shaped upper end support plate 34, and supplementary posts 35 installed so as to be hung from a lower surface of the upper end support plate 34 and respectively correspond to the support posts 31, and the upper ends of the support posts 31 are screwed to the lower ends of the supplementary posts 35. A female thread hole 34$h$ for a fixing screw 36 is formed at the center of the upper end support plate 34. The length of each support post 31 is much longer than that of the supplementary post 35, and thus thermal expansion of the supplementary post 35 in the length direction is negligible (although not shown, the supplementary post 35 may be omitted, and the support post 31 may be directly screwed to the upper end support plate 34).

Similar to the upper end support plate 34, the lower end support member 37 is a disk-shaped member and has mounting holes drilled so as correspond to the support posts 31, and the lower ends of the support posts 31 are screwed to the mounting holes, respectively. A protrusion 37$t$ for pressing the plunger 51 is protrusively formed at the center of a lower surface of the lower end support member 37. The protrusion 37$t$ is inserted in the through-hole 25$h$ of the bearing lower part 25. In addition, a spring lower part holding hole 37$h$ is formed so as to be recessed at the center of an upper surface of the lower end support member 37 while being aligned with the spring upper part holding hole 21$h$ of the bearing upper part 21. The elastic member 60 is provided between the spring upper part holding hole 21$h$ and the spring lower part holding hole 37$h$, and a screwing allowance with which the bearing upper part 21 is screwed into the bearing lower part 25 is adjusted such that a predetermined elastic force is produced. As described below, the elastic force is associated with a valve seat closing force (pressing force F) of the diaphragm 5 (the spring upper part holding hole 21$h$ and the spring lower part holding hole 37$h$ are for determining a position of the elastic member 60, but are allowed to be omitted).

The piezoelectric actuator part 40 includes the piezoelectric element 45, and a ball guide 41 mounted to the upper end of the piezoelectric element 45.

The piezoelectric element 45 has a length that rapidly changes according to the magnitude of the applied voltage, an expansion length thereof is zero when the applied voltage is zero, and the higher the applied voltage is, the larger the expansion length is. The length of the piezoelectric element 45 is denoted by T when the voltage applied to the piezoelectric element 45 is zero, and elongation of the piezoelectric element 45 is denoted by Δt when voltage is applied. Here, a reference surface M for measurement of elongation of the piezoelectric element 45 is a bottom surface of the piezoelectric element 45.

As described below, the position of the reference surface M of the piezoelectric element 45 is adjusted such that, when the expansion length Δt of the piezoelectric element 45 is zero (i.e., applied voltage is zero), the diaphragm 5 is pressed with an optimal elastic force by the elastic member 60, thereby closing the opening/closing port 3$k$ of the valve seat 3 with the reliable and appropriate pressing force F.

The piezoelectric element 45 has an extremely fast response speed with respect to applied voltage, and even if the voltage applied to the piezoelectric element 45 is set so as to have a pulse shape at very short time intervals, the expansion length Δt can be rapidly changed according to the applied voltage.

Between the lower end surface (reference surface M) of the piezoelectric element 45 and a bottom surface of the element accommodating hole 22 of the bearing upper part 21, the second steel ball P2 for point contact between both the surfaces is provided so as to be fitted in the steel ball fixing hole 21$k$.

The ball guide 41 is a columnar member mounted to the upper end of the piezoelectric element 45, and a positioning hole 42 in which a first steel ball P1 is to be fitted is drilled at the center of the ball guide 41. The fixing screw 36 is screwed in the female thread hole 34$h$ at the center of the upper end support plate 34. The first steel ball P1 that is mounted to the lower end of the fixing screw 36 to be inserted is located directly above the positioning hole 42, and the fixing screw 36 is screwed in the female thread hole 34$h$ at the center of the upper end support plate 34 with a clearance G larger than the screwed length of the bearing upper part 21 described below. The clearance G is expressed by a distance between contact points of the first steel ball P1 and the positioning hole 42. The mounted elastic member 60 has a free length, and the length is denoted by S1 (FIG. 2).

Figure 2:
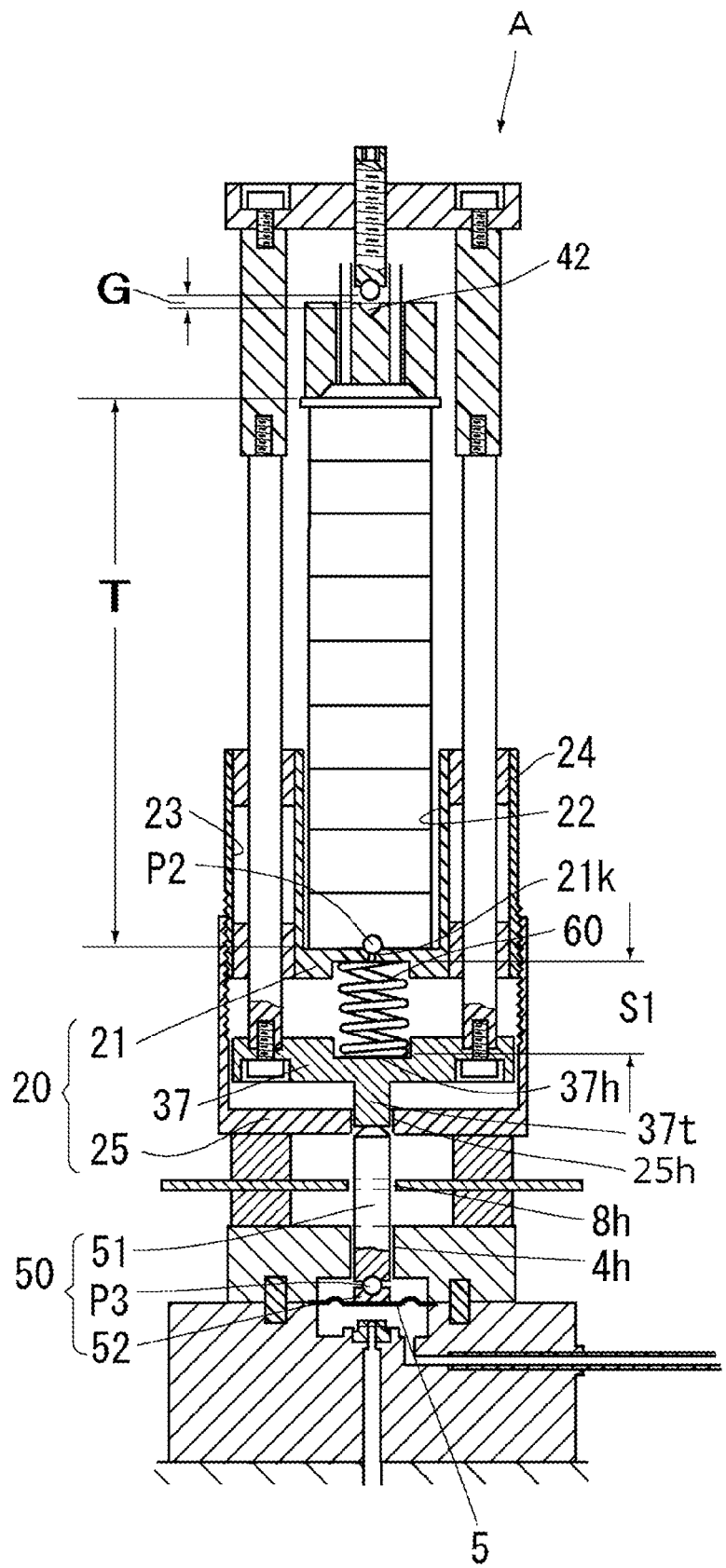
FIG. 2 is a longitudinal cross-sectional view in which no load is applied on an elastic member and the elastic member is in an initial state of assembly, according to one embodiment of the present invention shown in FIG. 1.
Figure 3:
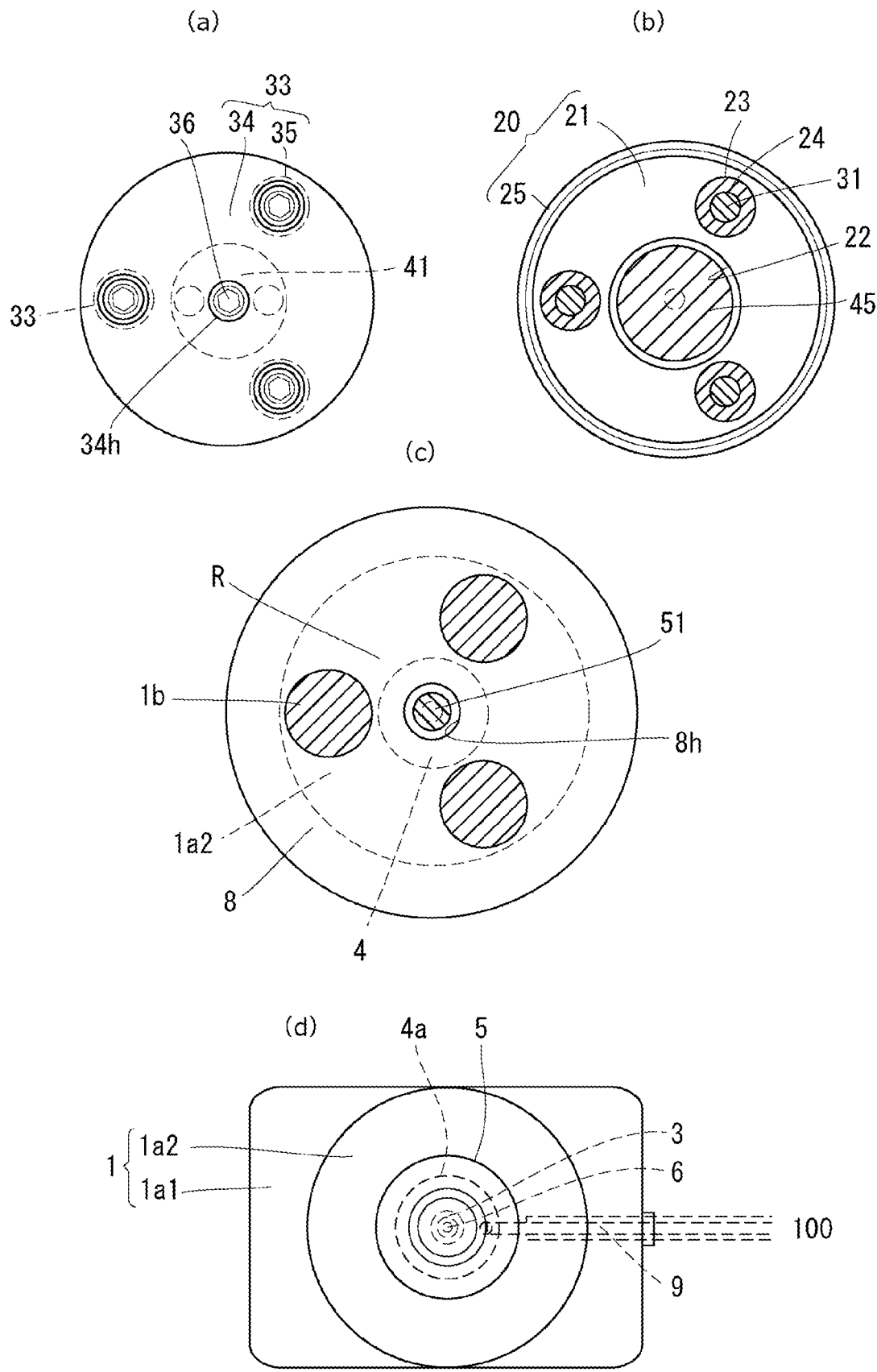
FIG. 3 is as follows.

An initial state of the flow rate control valve A configured as above is a state in which the length of the elastic member 60 is the free length S1 as shown in FIG. 2, and the elastic member 60 is placed, in this state, between the spring upper part holding hole 21$h$ of the bearing upper part 21 and the spring lower part holding hole 37$h$ of the lower end support member 37. At this time point, the bearing upper part 21 is screwed in the bearing lower part 25 as described above. On the other hand, the diaphragm 5 is not deformed and is separated from a seat surface of the valve seat 3 with tension thereof, and the opening/closing port 3$k$ is in an "opened state".

The valve-actuating part 50 is abutted on the diaphragm 5 to cause an opening/closing action of the diaphragm 5, and corresponds to the plunger 51, a third steel ball P3, and a protective plate 52 in the present embodiment.

The third steel ball P3 is fixed to the lower end of the plunger 51 and is abutted on the protective plate 52.

The protective plate 52 is a circular metal plate and has a hemispherical recess in which the lower portion of the third steel ball P3 is fitted at the center of an upper surface, and the lower surface of the protective plate 52 is flat and located so as to make surface contact with the valve part 5$a$ at the center of the diaphragm 5. The depth of the recess is smaller than a radius of the third steel ball P3, there is a gap between a lower surface of the plunger 51 and an upper surface of the protective plate 52, and the pressing force F applied to the plunger 51 is perpendicularly applied to the protective plate 52 via the third steel ball P3. Since the lower surface of the protective plate 52 is flat and makes surface contact with the valve part 5$a$ at the center of the diaphragm 5, the surface pressure is low, and the valve part 5$a$ is protected by the protective plate 52 and is not deformed.

The upper end of the plunger 51 is abutted on the protrusion 37$t$ of the lower end support member 37, and moves in the up-down direction along up-and-down movement of the protrusion 37$t$. The plunger 51 is inserted in the through-hole 8$h$ of the cooling fin 8 and the plunger guide hole 4$h$ of the second lower part 1$a$2.

As the elastic member 60, a compression coil spring is used in the present embodiment. Spring members other than the compression coil spring may also be used.

The elastic member 60 is deformed from the initial state to obtain an appropriate valve closing force (pressing force F) of the diaphragm 5. Specifically, in the initial state (FIG. 2), when the bearing upper part 21 is screwed to advance downward in the bearing lower part 25, the lower end support member 37 is pressed down via the elastic member 60, so that the protrusion 37t of the lower end support member 37 presses the plunger 51 down. Since the plunger 51 is in contact with the diaphragm 5 in an "opened state" via the third steel ball P3 and the protective plate 52, the diaphragm 5 is pressed and is deformed toward the valve seat 3.

When screwing of the bearing upper part 21 is continued, the diaphragm 5 is deformed so as to be eventually brought into contact with the valve seat 3, and the deformation of the diaphragm 5 stops in this state. At this time point, since the diaphragm 5 is simply in contact with the valve seat 3, liquid leakage is caused when pressure is received from the liquid raw material introduction passage 6. Therefore, in this state, the bearing upper part 21 is further continuously screwed. When screwing of the bearing upper part 21 is further continued, only the elastic member 60 is deformed, to gradually increase the pressing force F for pressing the valve seat 3 from the diaphragm 5. Then, when the diaphragm 5 is in a closed state with such the pressing force F as to prevent liquid leakage from the valve seat 3, screwing of the bearing upper part 21 is stopped, and then fixing is performed with a double nut or the screw part is fixed with an adhesive, for example. Accordingly, the bearing upper part 21 and the bearing lower part 25 are integrated, and setting of the deformation amount of the elastic member 60 ends. The length of the elastic member 60 at this time is denoted by S2 (FIG. 1(a)).

The first steel ball P1 of the fixing screw 36 is spaced apart from the positioning hole 42 of the ball guide 41 while sufficiently maintaining the clearance G during screwing of the bearing upper part 21 in the bearing lower part 25, and thus is not in contact with the positioning hole 42 even after the setting of the deformation amount of the elastic member 60 ends.

After the setting of the deformation amount ends, fastening is performed until the first steel ball P1 of the fixing screw 36 is brought into contact with the ball guide 41. At this time, excessive fastening changes the deformation amount of the elastic member 60 and causes liquid leakage, and thus the fastening amount is such an amount as to simply bring the first steel ball P1 into contact with the ball guide 41.

Accordingly, the flow rate control valve A functions as a "normally-closed" flow rate control valve. Specifically, the diaphragm 5 is deformed with the elastic force (pressing force F) of the elastic member 60, so that the valve seat 3 is normally closed.

Next, an action of the flow rate control valve A of the present invention will be described. The flow rate control valve A is incorporated into a publicly known semiconductor manufacturing system and used, for example. The flow rate control valve A is connected to a storage tank (not shown) and receives supply of the liquid raw material L from the storage tank. The supplied liquid raw material L is delivered to the valve seat 3 through the liquid raw material introduction passage 6.

In a "normally-closed state" in FIG. 1(a), the valve seat 3 is closed by the diaphragm 5 and stopped at the opening/closing port 3k. When an operation of vaporizing the liquid raw material L starts, voltage is applied to the piezoelectric element 45. The piezoelectric element 45 rapidly elongates upward with respect to the reference surface M according to the applied voltage, and the upper end support plate 34 is pressed up via the fixing screw 36 by the elongation amount. Such elongation is denoted by Δt. Accordingly, the support posts 31, and the lower end support member 37 provided to the lower end of the support posts 31 are rapidly moved upward by the amount (elongation Δt), and the elastic member 60 is compressed (by elongation Δt) by being pressed by the bearing upper part 21 fixed to the bearing lower part 25 as above. The length of the compressed elastic member 60 is denoted by S3 (FIG. 1(b)).

When the protrusion 37t of the lower end support member 37 pressing the plunger 51 is moved upward according to the expansion of the piezoelectric element 45, the diaphragm 5 is deformed in a returning direction according to the upward movement, and the plunger 51 is pressed up and the opening/closing port 3k of the valve seat 3 is opened. At this time, a lower end of the elastic member 60 is held by the lower end support member 37, and thus the elastic force thereof is applied to the elongated piezoelectric element 45 via the support posts 31 but not applied to the diaphragm 5. Therefore, the diaphragm 5 is returned with its own tension in the returning direction and is separated from the valve seat 3. Thus, the separation width is equivalent to the above Δt. Subsequently, the liquid raw material L flows into the valve chamber lower part 4a through the opened opening/closing port 3k, and flows into the vaporizing chamber 100 of the vaporizer through the liquid raw material supply path 9 that is open to a bottom part of the valve chamber lower part 4a.

To cause the valve seat 3 in this state to be in a "closed state", the applied voltage to the piezoelectric element 45 is caused to be zero. When the applied voltage becomes zero, the length of the piezoelectric element 45 rapidly returns to an original length T. The lower end support member 37 of the support post part 30 is lowered according to the contraction, and presses the diaphragm 5 down via the plunger 51. The diaphragm 5 is pressed down with the pressing force F of the elastic member 60, to close the valve seat 3 as above. Accordingly, the liquid raw material L is delivered precisely at an indicated flow rate to the vaporizing chamber 100 without any time lag.

In the above-described valve opening/closing operation, in the flow rate control valve A of the present invention, the base block lower part 1a and the valve opening/closing mechanism 10 are divided by the base block upper part 1b, and the cooling space R and the cooling fin 8 are provided in the base block upper part 1b. Thus, heat transferred from the base block lower part 1a side is dissipated by the cooling fin 8, and, at the same time, the base block upper part 1b is cooled with air in the cooling space R, and thus the valve opening/closing mechanism 10 receives no thermal influence from the base block lower part 1a provided with the valve chamber 4. In addition, the base block upper part 1b is formed from the plurality of post members each having a narrow cross section, whereby heat conduction from the base block lower part 1a is inhibited.

The linear expansion coefficient of the piezoelectric element 45 is close to zero on the valve opening/closing mechanism 10 side, and is nearly equal to the linear expansion coefficient of an alloy used in the support posts 31, whereby the dimensional change Δt of the piezoelectric element 45 is precisely and rapidly transmitted to the diaphragm 5.

In the present embodiment, although the plunger 51 and the third steel ball P3 are used as the valve-actuating part 50, the protrusion 37t may be used in place of the plunger 51 by elongating the protrusion 37t of the lower end support member 37, and the protrusion 37t and the third steel ball P3 may be used as the valve-actuating part 50.

REFERENCE SIGNS LIST

A flow rate control valve
F pressing force
G clearance
L liquid raw material
M reference surface
P1 to P3 first to third steel balls
R cooling space
S free length
T initial length of piezoelectric element
At elongation
1 base block
1a base block lower part
1a1 first lower part
1a2 second lower part
1b base block upper part
3 valve seat
3a seat part
3k opening/closing port
4 valve chamber
4a valve chamber lower part
4b valve chamber upper part
4h plunger guide hole
4s valve seat accommodating hole
4t ring-shaped projecting ridge part
5 diaphragm
5a valve part
6 liquid raw material introduction passage
8 cooling fin
8h through-hole
9 liquid raw material supply path
10 valve opening/closing mechanism
20 slide bearing part
21 bearing upper part
21h spring upper part holding hole
21k steel ball fixing hole
22 element accommodating hole
23 support post holding hole
24 bearing
25 bearing lower part
25h through-hole
30 support post part
31 support post
33 upper end support member
34 upper end support plate
34h female thread hole
35 supplementary post
36 fixing screw
37 lower end support member
37h spring lower part holding hole
37t protrusion
40 piezoelectric actuator part
41 ball guide
42 positioning hole
45 piezoelectric element
50 valve-actuating part
51 plunger
52 protective plate
60 elastic member
100 vaporizing chamber

The invention claimed is:

1. A normally-closed flow rate control valve, comprising:
a base block provided with a valve chamber in which a valve seat through which a liquid raw material flows, and a diaphragm that is brought into contact with or separated from the valve seat so as to close/open the valve seat are installed; and
a valve opening/closing mechanism that performs opening/closing drive of the diaphragm, wherein
the valve opening/closing mechanism includes:
a slide bearing part installed on the base block and provided with a bearing;
a support post part including a support post that is inserted slidably in the bearing and that moves upward and downward in a diaphragm direction;
a piezoelectric actuator part provided between the slide bearing part and the support post part, the piezoelectric actuator part including a piezoelectric element that expands by application of voltage, and presses up the support post part in such a direction as to separate the support post part from the diaphragm with respect to the slide bearing part as a reference; and
a valve-actuating part that is provided from the support post part toward the diaphragm and that performs opening/closing drive of the diaphragm along up-and-down movement of the support post part,
the support post of the support post part is made of a low thermal expansion member,
the slide bearing part includes a bearing lower part that is bottomed and that has an opened upper face, and a bearing upper part that is screwed movably forward and backward in the bearing lower part and that is provided with the bearing in which the support post is inserted,
the support post part includes the support post, an upper end support member that is provided on an upper end of the support post and on which an upper end of the piezoelectric actuator part is abutted, and a lower end support member provided between the bearing upper part and the bearing lower part, and
an elastic member is installed between the bearing upper part and the lower end support member.

2. The normally-closed flow rate control valve according to claim 1, wherein
the base block includes a base block lower part including the valve chamber formed therein, and a base block upper part on which the slide bearing part is provided, and
at least one of a cooling space and a cooling fin is disposed in the base block upper part.

3. The normally-closed flow rate control valve according to claim 1, wherein
the valve-actuating part includes a plunger provided from the support post part toward the diaphragm, a protective plate that is in planar contact with an upper surface of the diaphragm, and a steel ball provided between the plunger and the protective plate.

* * * * *